(12) United States Patent
Berdy et al.

(10) Patent No.: US 10,944,379 B2
(45) Date of Patent: Mar. 9, 2021

(54) HYBRID PASSIVE-ON-GLASS (POG) ACOUSTIC FILTER

(71) Applicant: QUALCOMM Incorporated, San Diego, CA (US)

(72) Inventors: David Francis Berdy, San Diego, CA (US); Changhan Hobie Yun, San Diego, CA (US); Shiqun Gu, San Diego, CA (US); Niranjan Sunil Mudakatte, San Diego, CA (US); Mario Francisco Velez, San Diego, CA (US); Chengjie Zuo, San Diego, CA (US); Jonghae Kim, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 521 days.

(21) Appl. No.: 15/379,392

(22) Filed: Dec. 14, 2016

(65) Prior Publication Data

US 2018/0167054 A1    Jun. 14, 2018

(51) Int. Cl.
*H03H 9/05* (2006.01)
*H03H 9/64* (2006.01)
(Continued)

(52) U.S. Cl.
CPC .......... *H03H 9/0552* (2013.01); *H03H 3/02* (2013.01); *H03H 3/08* (2013.01); *H03H 9/059* (2013.01);
(Continued)

(58) Field of Classification Search
CPC .......... H03H 3/02; H03H 3/08; H03H 9/0523; H03H 9/0538; H03H 9/0547;
(Continued)

(56) References Cited

U.S. PATENT DOCUMENTS 6,628,178 B2 * 9/2003 Uchikoba ............... H01L 24/97
257/728
6,784,765 B2 * 8/2004 Yamada ............. H01L 23/5385
257/700
(Continued)

FOREIGN PATENT DOCUMENTS

JP         06-006170 A  * 1/1994
JP       2006-203652 A  * 8/2006
WO   WO 2014/017514 A1 * 1/2014

OTHER PUBLICATIONS

Takahashi et al.; "Development of Through Glass Via (TGV) Formation Technology Using Electrical Discharging for 2.5/3D Integrated Packaging"; 2013 IEEE Electronic Components & Technology Conference, pp. 348-352. (Year: 2013).*
(Continued)

*Primary Examiner* — Barbara Summons
(74) *Attorney, Agent, or Firm* — Seyfarth Shaw LLP

(57) ABSTRACT

An integrated radio frequency (RF) circuit combines complementary features of passive devices and acoustic filters and includes a first die, a second die, and a third die. The first die includes a substrate having one or more passive devices. The second die includes a first acoustic filter. The second die is stacked and coupled to a first surface of the first die. The third die includes a second acoustic filter. The third die is stacked and coupled to a second surface opposite the first surface of the first die.

19 Claims, 11 Drawing Sheets

(51) Int. Cl.
*H03H 3/08* (2006.01)
*H03H 9/72* (2006.01)
*H03H 9/70* (2006.01)
*H03H 3/02* (2006.01)

(52) U.S. Cl.
CPC ........ *H03H 9/0523* (2013.01); *H03H 9/0547* (2013.01); *H03H 9/0561* (2013.01); *H03H 9/0571* (2013.01); *H03H 9/0576* (2013.01); *H03H 9/64* (2013.01); *H03H 9/703* (2013.01); *H03H 9/72* (2013.01)

(58) Field of Classification Search
CPC .. H03H 9/0552; H03H 9/0557; H03H 9/0561; H03H 9/059; H03H 9/54; H03H 9/542; H03H 9/64; H03H 9/703; H03H 9/72; H03H 9/0571; H03H 9/0576
USPC ........................................ 333/133, 193, 189
See application file for complete search history.

(56) References Cited

U.S. PATENT DOCUMENTS

| | | | |
|---|---|---|---|
| 7,289,008 B2* | 10/2007 | Kuroki | H03H 9/725 333/133 |
| 7,492,242 B2 | 2/2009 | Carpentier | |
| 8,294,535 B2* | 10/2012 | Feiertag | H03H 9/059 333/187 |
| 9,171,797 B2 | 10/2015 | Lin et al. | |
| 9,831,850 B2* | 11/2017 | Kuroyanagi | H03H 9/02992 |
| 9,954,267 B2* | 4/2018 | Yun | H01P 5/16 |
| 2006/0131691 A1* | 6/2006 | Roozeboom | H01L 21/76898 257/534 |
| 2007/0115079 A1* | 5/2007 | Kubo | B81C 1/00238 333/189 |
| 2008/0217708 A1* | 9/2008 | Reisner | H01L 23/3121 257/416 |
| 2010/0045145 A1* | 2/2010 | Tsuda | H03H 3/08 310/365 |
| 2012/0049978 A1 | 3/2012 | Pang et al. | |
| 2012/0286894 A1 | 11/2012 | Vogas | |
| 2013/0163212 A1 | 6/2013 | Tanaka et al. | |
| 2014/0197915 A1 | 7/2014 | Sato et al. | |
| 2014/0232477 A1 | 8/2014 | Park et al. | |
| 2015/0123744 A1 | 5/2015 | Nishimura et al. | |
| 2015/0222300 A1 | 8/2015 | Schmidhammer et al. | |
| 2016/0301382 A1* | 10/2016 | Iwamoto | H04B 1/006 |
| 2017/0179920 A1* | 6/2017 | Kawasaki | H03H 9/02952 |
| 2017/0331455 A1* | 11/2017 | Kuroyanagi | H01L 23/5226 |

OTHER PUBLICATIONS

English language machine translation of JP 06-006170 A, published Jan. 14, 1994, 4 pages. (Year: 1994).*
English language machine translation of JP 2006-203652 A, published Aug. 3, 2006, 6 pages. (Year: 2006).*
English language machine translation of WO 2014/017514 A1, published Jan. 30, 2014, 10 pages. (Year: 2014).*
International Search Report and Written Opinion—PCT/US2017/061339—ISA/EPO —dated Feb. 6, 2018.
Jones R.E., et al., "System-in-a-Package Integration of SAW RF Rx Filter Stacked on a Transceiver Chip", IEEE Transactions on Advanced Packaging, vol. 28, No. 2, May 2005, pp. 310-319.

* cited by examiner

HYBRID PASSIVE-ON-GLASS (POG) ACOUSTIC FILTER

TECHNICAL FIELD

The present disclosure generally relates to integrated circuits (ICs). More specifically, one aspect of the present disclosure relates to an integrated radio frequency circuit that combines features of passive-on-glass (POG) devices and acoustic filters to achieve narrow band elements as well as wideband elements.

BACKGROUND

Low pass filters and high pass filters can be used for rejecting harmonics in communication signals. Low pass filters and high pass filters can also be used in carrier aggregation systems that combine multiple component carriers to achieve high data transmission rates in wireless communications. In carrier aggregation applications, however, low pass filters and high pass filters specify very low loss (e.g., very low levels of insertion loss), which is very difficult to achieve for conventional technologies (e.g., low temperature co-fired ceramic devices). Insertion loss is a metric, usually measured in decibels (dB), that expresses the loss of signal power resulting from the insertion of a device (e.g., a low pass filter or a high pass filter) into a transmission system (e.g., a wireless network). The lower the insertion loss, the more stable and powerful the device is in efficiently propagating signals through a network.

Fabricating high performance filters with low loss (e.g., insertion loss) is a challenge. Furthermore, reducing the insertion loss while achieving sharp filter roll off and increased bandwidth is even more of a challenge. A filter design that achieves low insertion loss, while achieving sharp filter roll off and increased bandwidth, would be beneficial.

SUMMARY

An integrated radio frequency circuit may include a first die having a substrate. The substrate may include one or more passive devices. The integrated radio frequency circuit may further include a second die including a first acoustic filter. The second die is stacked and coupled to a first surface of the first die. Furthermore, the integrated radio frequency circuit includes a third die including a second acoustic filter. The third die is stacked and coupled to a second surface opposite the first surface of the first die.

A method of fabricating an integrated radio frequency circuit may include fabricating a first die including a substrate. The substrate includes one or more passive devices. The method may further include fabricating a second die including a first acoustic filter. The method also includes stacking the second die on a first surface of the first die. The second die is communicatively coupled to the first die. In addition, the method includes fabricating a third die including a second acoustic filter. Furthermore, the method includes stacking the third die to a second surface opposite the first surface of the first die. The third die is communicatively coupled to the first die.

This has outlined, rather broadly, the features and technical advantages of the present disclosure in order that the detailed description that follows may be better understood. Additional features and advantages of the disclosure will be described below. It should be appreciated by those skilled in the art that this disclosure may be readily utilized as a basis for modifying or designing other structures for carrying out the same purposes of the present disclosure. It should also be realized by those skilled in the art that such equivalent constructions do not depart from the teachings of the disclosure as set forth in the appended claims. The novel features, which are believed to be characteristic of the disclosure, both as to its organization and method of operation, together with further objects and advantages, will be better understood from the following description when considered in connection with the accompanying figures. It is to be expressly understood, however, that each of the figures is provided for the purpose of illustration and description only and is not intended as a definition of the limits of the present disclosure.

BRIEF DESCRIPTION OF THE DRAWINGS

For a more complete understanding of the present disclosure, reference is now made to the following description taken in conjunction with the accompanying drawings.

DETAILED DESCRIPTION

Figure 1:
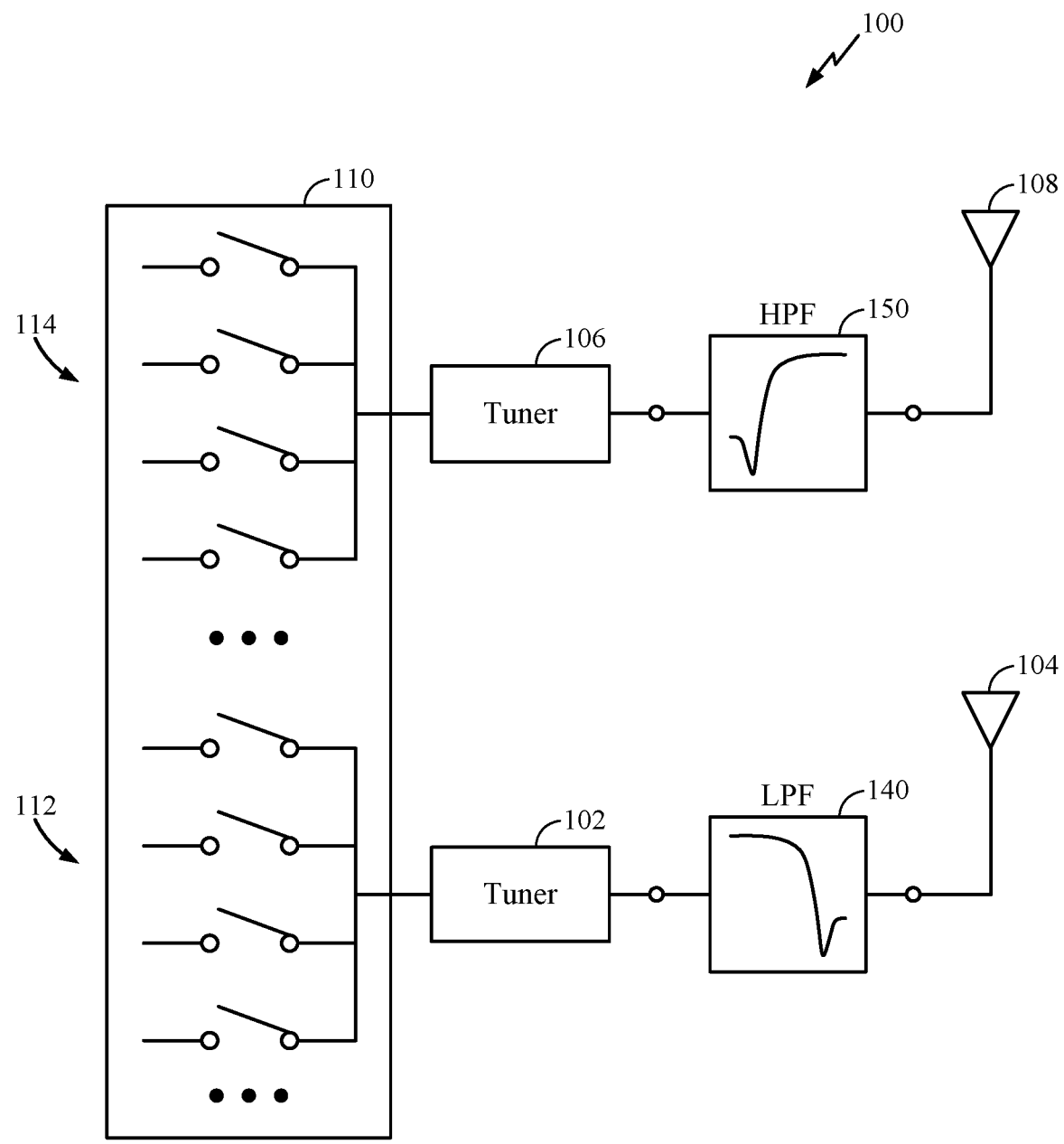
FIG. 1 is a schematic diagram of a dual-feed antenna chipset.

The detailed description set forth below, in connection with the appended drawings, is intended as a description of various configurations and is not intended to represent the only configuration in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts. As described herein, the use of the term "and/or" is intended to represent an "inclusive OR", and the use of the term "or" is intended to represent an "exclusive OR".

Passive device fabrication technology (e.g., passive-on-glass (POG) technology) involves high performance components such as inductors and capacitors that are built upon a substrate (e.g., a highly insulative substrate) that may also have a very low loss (e.g., insertion loss). Passive-on-glass devices, including inductor and capacitor components, have a variety of advantages over other technologies, such as surface mount technology or multi-layer ceramic chips that are commonly used in the fabrication of mobile radio frequency (RF) chips (e.g., mobile RF transceivers). The design complexity of implementing carrier aggregation in mobile RF transceivers is improved by the use of passive-on-glass devices.

The implementation of carrier aggregation in mobile RF transceivers enables a wireless carrier, owning rights to multiple frequency bands (e.g., 700 MHz and 2 GHz) in a particular geographic area, to maximize available bandwidth by simultaneously using both frequencies for a single communication stream. While an increased amount of data is provided to the end user, successful implementation of carrier aggregation is complicated by noise created at the harmonic frequencies due to the frequencies used for data transmission. For example, 700 MHz transmissions may create harmonics at 2.1 GHz, which interfere with data broadcast at 2 GHz. This noise is reduced when passive devices are used to process signals carried in a carrier aggregation system.

Aspects of the present disclosure are directed to an integrated RF circuit that combines the complementary features of passive devices (e.g., passive-on-glass and/or integrated passive devices) and acoustic filters. The integrated radio frequency circuit includes a first die, a second die, and a third die. The first die includes a substrate having one or more passive devices. For example, the first die includes a passive device layer including passive-on-glass (POG) devices and/or integrated passive devices (IPDs). In one aspect of the disclosure, the passive-on-glass devices and/or the integrated passive devices comprise two-dimensional (2D) passive devices or three-dimensional (3D) passive devices.

The second die may include a first acoustic filter, in which the second die is stacked and coupled to a first surface of the first die. For example, the second die is directly coupled to the passive device layer of the first die. The third die includes a second acoustic filter. In one aspect of the present disclosure, the second die includes a bulk acoustic wave (BAW) filter or a surface acoustic wave (SAW) filter and the third die comprises a BAW filter or a SAW filter. The BAW filter may be a film bulk acoustic resonator (FBAR) filter, which is a form of bulk acoustic wave (BAW) filter that has superior performance with steep rejection curves.

The third die is stacked and coupled to a second surface opposite the first surface of the first die. For example, different acoustic filters are arranged on opposing surfaces of a passive-on-glass/integrated passive device die, in which the different acoustic filters are communicably coupled by vias (e.g., through glass vias) through the first die. For example, the first die is formed of glass (e.g., glass substrate) and the via comprises a through glass via.

The two different acoustic filters may be independent filters and be independently operated under different frequencies. For example, each of the different filters may be different types of filters. A first acoustic filter on one surface may be a low pass filter while another acoustic filter on another surface may be a high pass filter. Alternatively, the different acoustic filters on opposite sides of the first die may be coupled through vias to generate cutoff frequencies that cannot be independently generated otherwise. For example, the filters may be functionally configured into a single filter when coupled through the first die. In one aspect, a single filter may be constructed such that an acoustic filter on one surface provides a steep rejection at one frequency while an acoustic filter on the other surface provides a rejection at a different frequency.

Although only two dies are described on opposite surfaces of the first die, more dies having acoustic filters may be stacked on the opposite surfaces of the first die. For example, a fourth die comprising a third acoustic filter may be stacked and coupled to the first surface of the first die. Similarly, a fifth die comprising a fourth acoustic filter may be stacked and coupled to the second surface of the first die. In one aspect, the integrated circuit may be incorporated in a multiplexer.

FIG. 1 is a schematic diagram of a dual-feed antenna chipset 100. The dual-feed antenna chipset 100 includes a low pass filter 140 and a high pass filter 150. The dual-feed antenna chipset 100 may be used for carrier aggregation purposes, where both high band and low band frequencies are used at the same time for wireless communications. Conventional low pass filters and high pass filters have a high insertion loss that is usually around 0.3 dB. This level of insertion loss is too high for carrier aggregation applications because of significant signal power loss from the high pass filter 150 and the low pass filter 140. In one aspect of the present disclosure, the low pass filter 140 and the high pass filter 150 of the dual-feed antenna chipset 100 may be designed and implemented to achieve low insertion losses less than 0.2 dB while achieving sharp filter roll off and increased bandwidth.

Representatively, a first antenna 104 is coupled to the input of the low pass filter 140, and a second antenna 108 is coupled to the input of the high pass filter 150. The first antenna 104 and the second antenna 108 communicate signals processed by the low pass filter 140 and the high pass filter 150. A first antenna tuner 102 is coupled to one port of the low pass filter 140. A second antenna tuner 106 is coupled to one port of the high pass filter 150. The first antenna tuner 102 and the second antenna tuner 106 are optional, but if present they adjust the impedance of the first antenna 104 or second antenna 108 for a better matching with the rest of the circuit. The first antenna tuner 102 and the second antenna tuner 106 are also coupled to a set of switches 110. The set of switches 110 may be used to select the desired operating frequency band for wireless communication. The set of switches 110 can also be divided into a low band frequency part 112 (e.g., 1 GHz) and a high band frequency part 114 (e.g., 2 GHz). The low band frequency part 112 coordinates signals having low band frequencies that are processed by the low pass filter 140. The high band frequency part 114 coordinates high band frequencies that are processed by the high pass filter 150.

In conventional implementations, the insertion loss of the low pass filter 140 and the high pass filter 150 would be around 0.3 dB. This insertion loss may be too high for carrier aggregation applications, and results in undue amounts of signal power loss and heat generation. In the dual-feed antenna chipset 100 configuration of FIG. 1, the low pass filter 140 and the high pass filter 150 may be configured to have lower insertion loss while achieving sharp filter roll off and increased bandwidth, for example, as shown in FIGS. 4, 5, 6A, and 6B.

Figure 2:
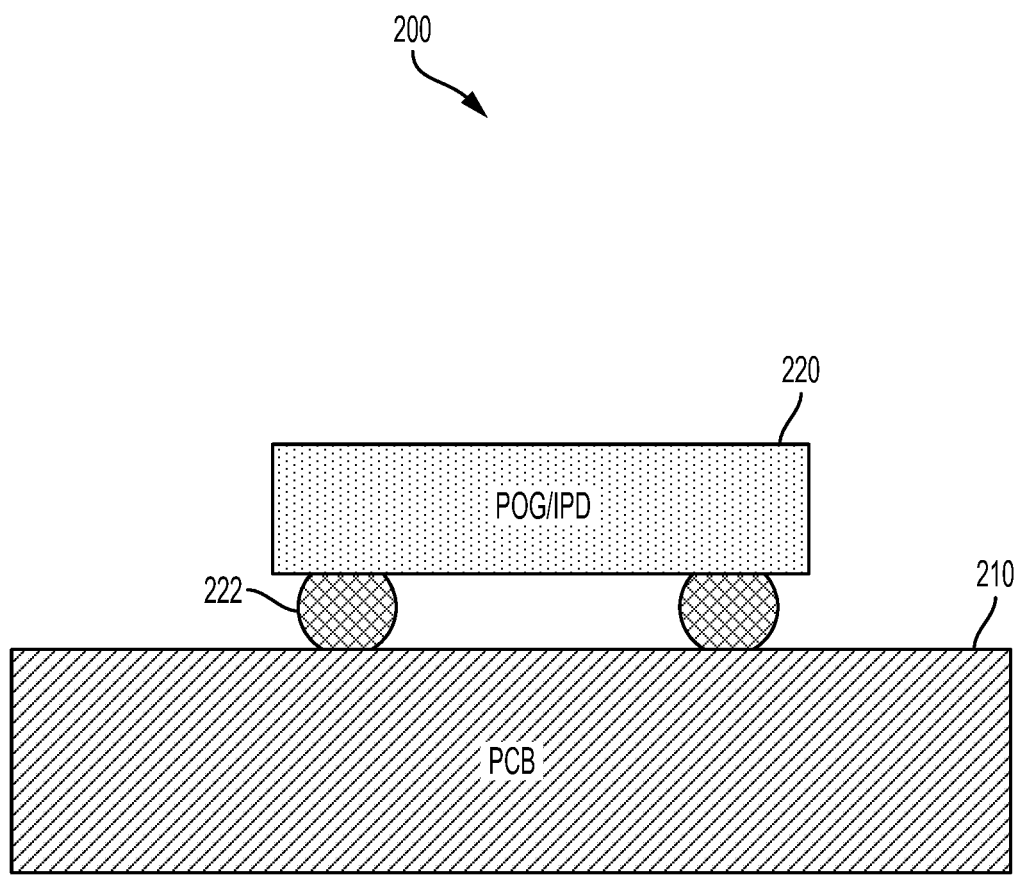
FIG. 2 illustrates a cross-sectional view of a packaged die including a passive-on-glass (POG) device or integrated passive device on a printed circuit board.

FIG. 2 illustrates a cross-sectional view of an integrated circuit 200 including a semiconductor device (e.g., integrated passive device (IPD)) 220 on a packaging substrate 210. It is noted that the semiconductor device 220 could alternatively be a passive-on-glass device, in which case the packaging substrate could be a printed circuit board (PCB). For the sake of explanation, the semiconductor aspects will be described, although it is understood that passive-on-glass aspects are also covered. The terms passive-on-glass device and semiconductor device may be used interchangeably in this description. Moreover, the term "die" will be used to cover both aspects. The packaging substrate (or the printed circuit board (PCB) or even interposer) 210 of the IC 200 is coupled to the semiconductor device 220. The packaging substrate 210 supports the semiconductor device 220. The semiconductor device 220 is attached to a first side of the packaging substrate 210 by an interface connection or interconnect packaging (e.g., bumps or pillars) 222. Other methods of interface interconnection may also be used to attach the semiconductor device 220 to the packaging substrate 210 such as ball grid array (BGA) packaging, pin grid array (PGA), or land grid array (LGA). The packaging substrate 210 may also include ball grid array (BGA) packaging on a second side of the packaging substrate 210 opposite the first side to facilitate further processing.

The passive-on-glass device or the integrated passive device of the semiconductor device 220 may include one or more capacitors and/or inductors. In addition, one or more capacitors and/or inductors may be embedded in the packaging substrate 210 and used for decoupling of the semiconductor device 220. The one or more capacitors and/or inductors of the semiconductor device 220 and/or the one or more capacitors and/or inductors of the packaging substrate 210 may be configured to form filters for wired or wireless communication. The packaging substrate 210 may also include a number of interconnects (not shown) to support various functions of the packaging substrate 210 or the IC 200. The filters formed by these capacitors and inductors, however, may be subject to high insertion loss, and filter roll off that is not sharp.

Figure 3:
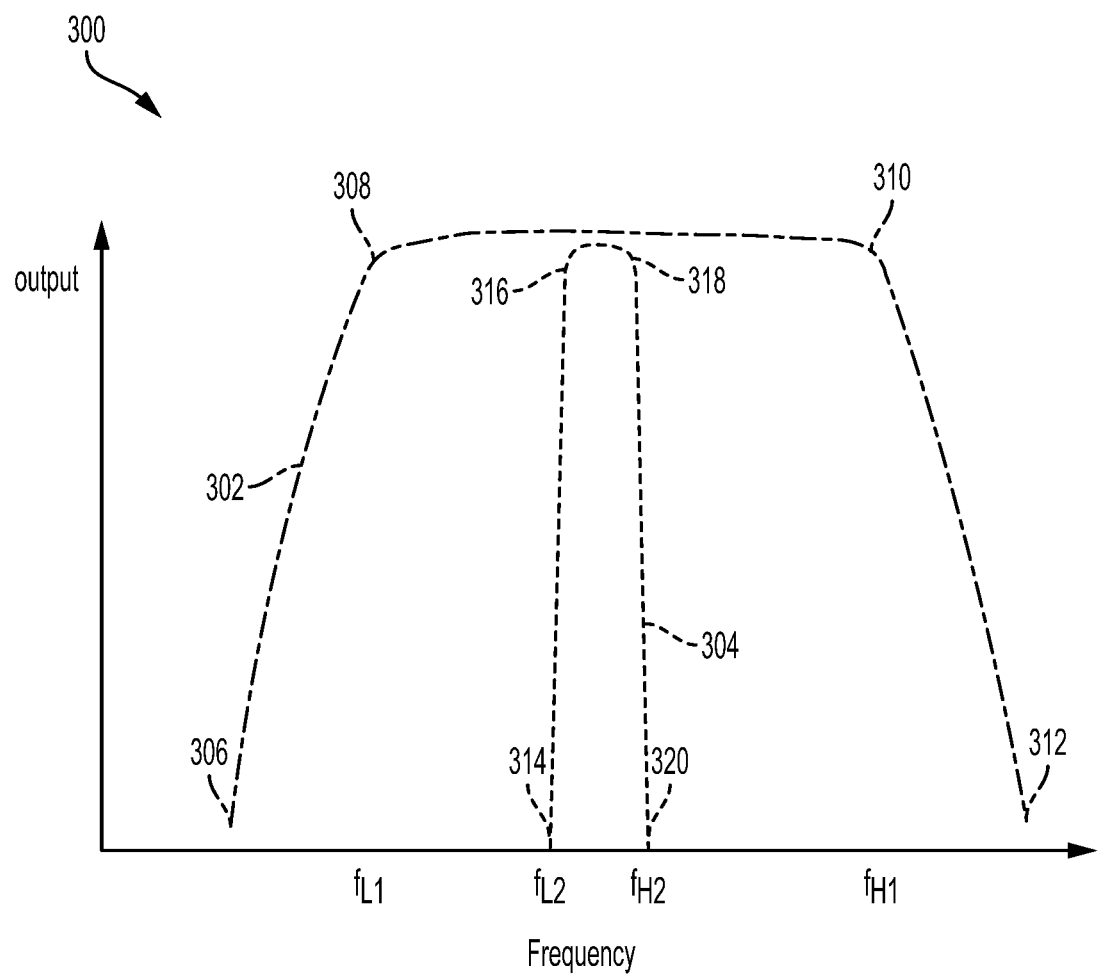
FIG. 3 is a graph illustrating frequency response plots of different filter implementations.

FIG. 3 is a graph 300 illustrating frequency response plots of different filter implementations. The x-axis of the graph 300 represents frequency while the y-axis represents a magnitude of the output of the filter. For example, the graph 300 includes a first frequency response plot 302 of a passive-on-glass filter and a second frequency response plot 304 of an acoustic filter.

Referring to the first frequency response plot 302 of the passive-on-glass filter, a signal is attenuated at low frequencies (e.g., between points 306 and 308) until the frequency reaches a lower cutoff frequency $f_{L1}$. The output continues at a maximum gain from point 308 corresponding to the lower cutoff frequency $f_{L1}$ until it reaches an upper cutoff frequency $f_{H1}$ at point 310 where the output decreases to attenuate any high frequency signals.

Referring to the second frequency response plot 304 of the acoustic filter, a signal is attenuated at low frequencies (e.g., between points 314 and 316) until the frequency reaches a lower cutoff frequency $f_{L2}$. The output continues at a maximum gain from point 316 corresponding to the lower cutoff frequency $f_{L2}$ until it reaches an upper cutoff frequency $f_{H2}$ at point 318 where the output decreases at a higher rate relative to that of the first frequency response plot 302 to attenuate any high frequency signals.

As illustrated by the first frequency response plot 302, the passive-on-glass filter (e.g., passive-on-glass filter implemented on the semiconductor device 220) achieves wider bandwidth (e.g., from $f_{L1}$-$f_{H1}$) relative to the bandwidth (e.g., from $f_{L2}$-$f_{H2}$) achieved by the second frequency response plot 304 of the acoustic filter. However, the quality (Q)-factor (~50) of the passive-on-glass filter is relatively low leading to a slow roll off at the band edge (e.g., between points 310 and 312). Acoustic filters (e.g., surface acoustic wave filter, bulk acoustic wave filter, however, achieve very high quality (Q)-factor (>500), but have limited bandwidth (e.g., from $f_{L2}$-$f_{H2}$). As a result, the second frequency response plot 304 of the acoustic filter illustrates a sharper roll off at a band edge (e.g., between points 318 and 320) relative to the roll off (e.g., between points 310 and 312) of the first frequency response plot 302 of the passive-on-glass filter.

Aspects of the present disclosure are directed to mitigating the disadvantages associated with passive-on-glass (or IPD) filters and acoustic filters operating independently.

Filter designs that achieve low insertion loss, while achieving sharp filter roll off and increased bandwidth, would be beneficial, and are illustrated in FIGS. 4, 5, 6A, and 6B.

Figure 4:
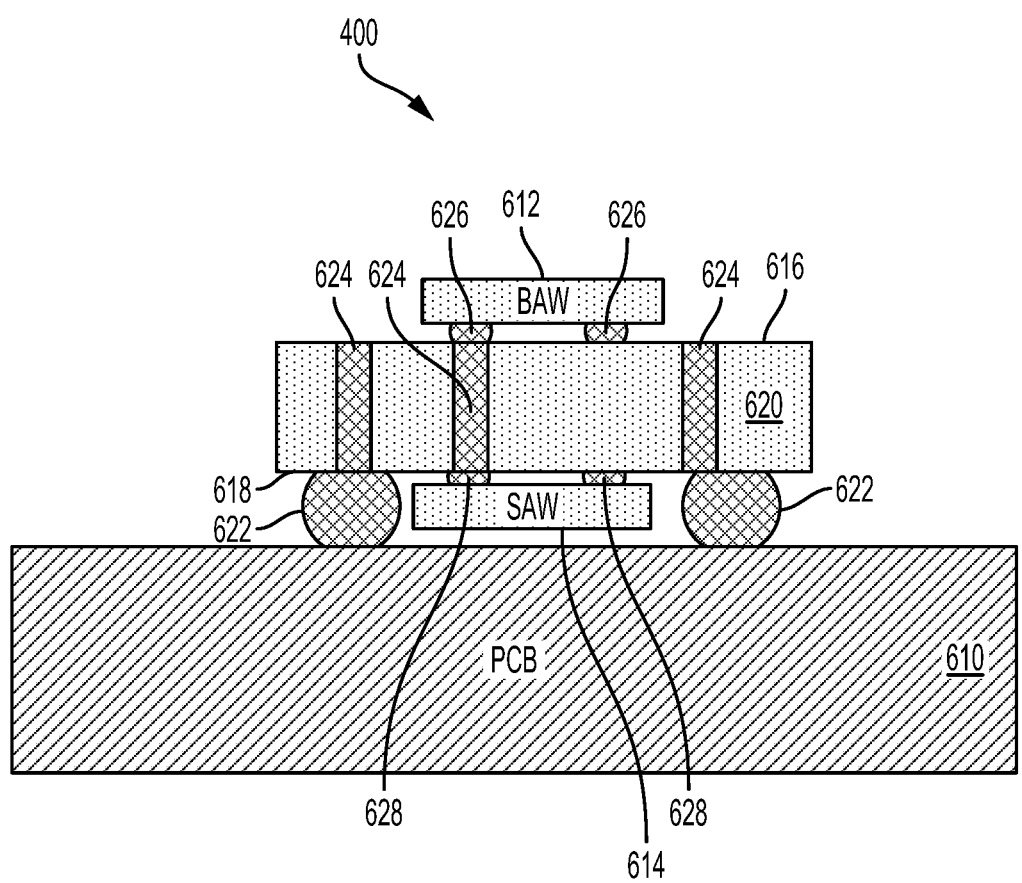
FIGS. 4-5 illustrate filters that reduce loss (e.g., insertion loss) and achieve sharp filter roll off and increased bandwidth according to aspects of the present disclosure

FIG. 4 illustrates a filter 400 that reduces loss (e.g., insertion loss) and achieves sharp filter roll off and increased bandwidth, according to aspects of the present disclosure. The filter 400 includes a semiconductor device (e.g., passive-on-glass device or integrated passive device) 620 on a packaging substrate (or printed circuit board) 610. The packaging substrate (or the printed circuit board (PCB)) 610 of the filter 400 is coupled to the semiconductor device 620 by an interface connection 622 (e.g., similar to the interface connection 222). The filter 400 further includes a first acoustic filter (e.g., bulk acoustic wave (BAW) filter) 612 and a second acoustic filter (e.g., a surface acoustic wave (SAW) filter) 614. These acoustic filters can comprise silicon or quartz substrates, for example.

In one aspect of the disclosure, the semiconductor device 620 is a three-dimensional (3D) semiconductor device. The 3D semiconductor device 620 includes through vias 624 to enable communication between devices on either opposing side of the 3D semiconductor device 620. In some aspects, when a substrate of the 3D semiconductor device 620 is glass, the through via is a through glass via (TGV). The packaging substrate 610 may be coupled to one or more of the through vias. For example, two of the interface connections 622 between the packaging substrate 610 and the 3D semiconductor device 620 is directly coupled to two of the through vias 624 in the 3D semiconductor device 620. The second acoustic filter 614 may be coupled to a side of the 3D semiconductor device 620 in an area depopulated of the interface connections 622.

In some aspects of the present disclosure, the first acoustic filter 612 and the second acoustic filter 614 are stacked on opposite sides or surfaces of the 3D semiconductor device 620 and coupled to the 3D semiconductor device 620 with bumps 626 and 628, respectively. For example, the first acoustic filter 612 may be stacked on a first surface 616 of the semiconductor device 620 and the second acoustic filter 614 may be stacked on a second surface 618 of the semiconductor device 620. The bumps 626 are positioned between the 3D semiconductor device 620 and the first acoustic filter 612, and one of the bumps 626 is directly coupled to one of the through vias 624 in the 3D semiconductor device 620. Similarly, the bumps 628 are positioned between the 3D semiconductor device 620 and the second acoustic filter 614, and one of the bumps 628 is directly coupled to one of the through vias 624 in the 3D semiconductor device 620.

In some aspects, one or more of the bumps 628 may not be coupled to a via 624. Instead, the one or more of the bumps 628 may be coupled to the second surface 618 of the semiconductor device 620 to communicatively couple the second acoustic filter 614 to the semiconductor device 620.

The bump 628 that is coupled to the via 624 communicatively couples the second acoustic filter 614 to the first acoustic filter 612.

Figure 5:
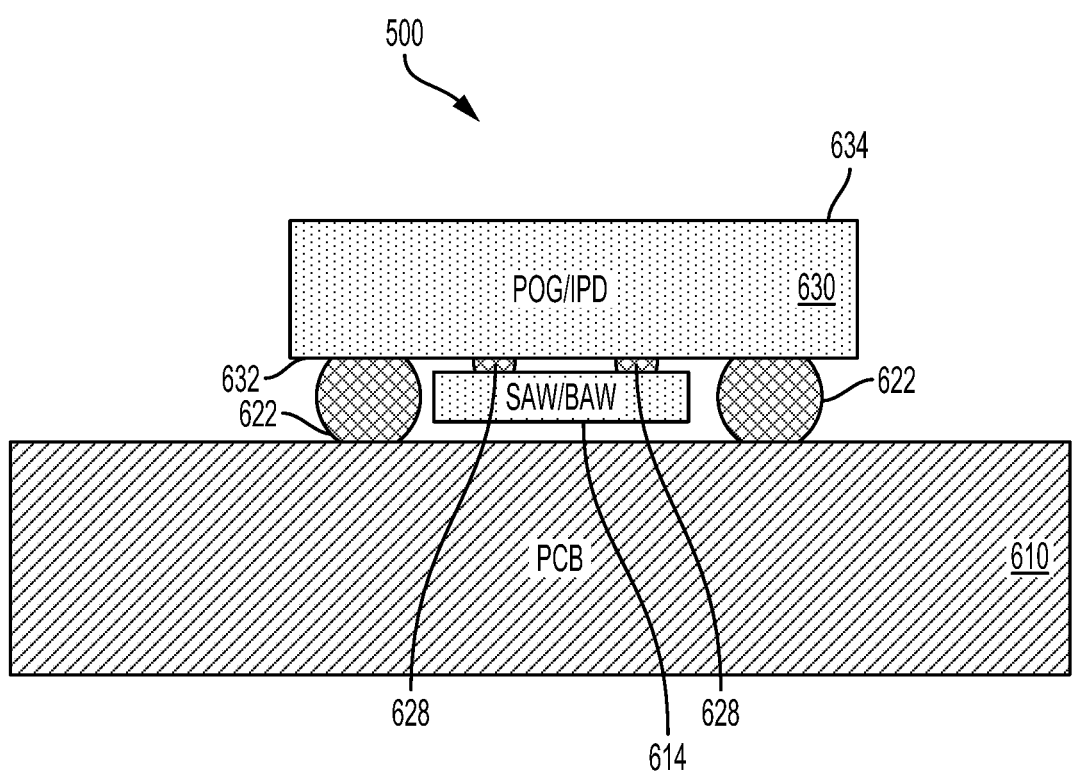

FIG. 5 illustrates another filter 500 that reduces loss (e.g., insertion loss) and achieves sharp filter roll off and increased bandwidth, according to aspects of the present disclosure. For illustrative purposes, some or all of the labelling and numbering of the components and features of FIG. 5 are similar to those of FIG. 4. For example, the packaging substrate 610, the second acoustic filter 614, bumps 628, and the interface connections 622 are the same for FIG. 4 and FIG. 5. However, the semiconductor device 630 of FIG. 5 is a two-dimensional (2D) semiconductor device (e.g., without through vias) while the semiconductor device of FIG. 4 is a 3D semiconductor device. The semiconductor device 630 includes a first surface 632 on which the bumps 628, the interface connections 622 and the second acoustic filter 614 are coupled and a second surface 634 opposite the first surface 632. The second acoustic filter 614 is communicatively coupled to the semiconductor device 630 by the bumps 628. For example, the second acoustic filter 614 may be coupled to a side of the semiconductor device 630 in an area depopulated of the interface connections 622. The second acoustic filter 614 may be a bulk acoustic wave filter or a surface acoustic wave filter. Although not shown, other acoustic wave filters may be coupled to the first surface 632 and/or the second surface 634 of the semiconductor device 630.

Figure 6A:
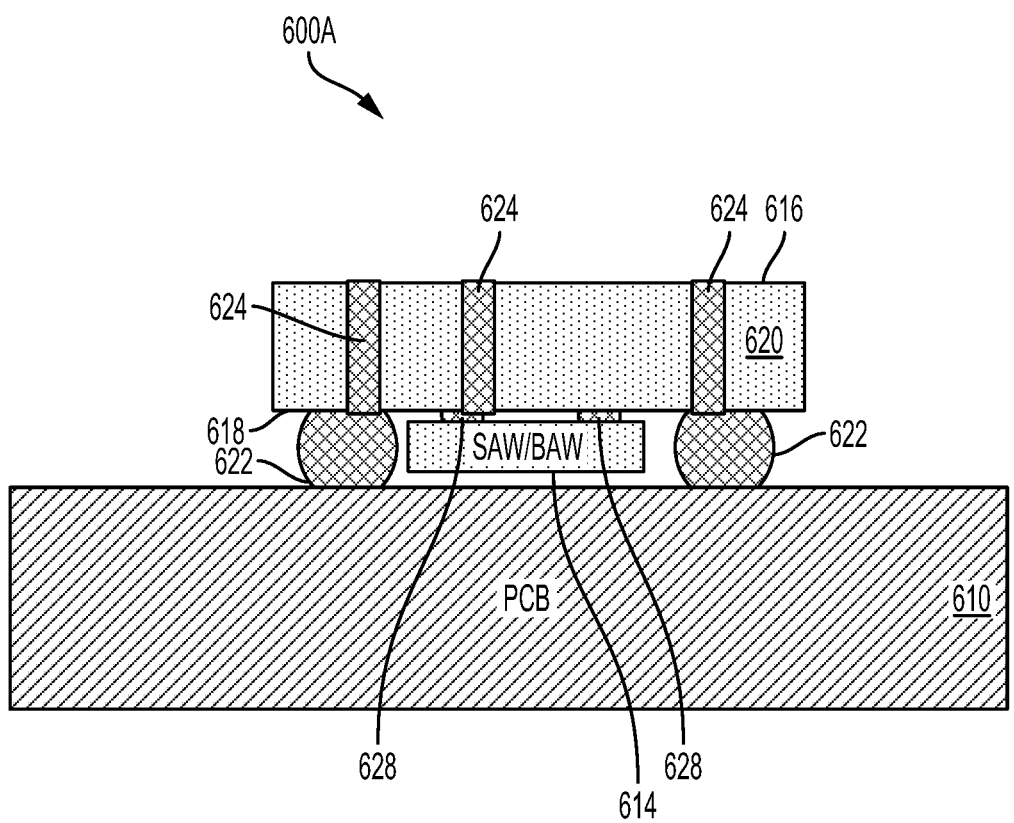
FIGS. 6A-6B illustrate filters that reduce loss (e.g., insertion loss) and achieve sharp filter roll off and increased bandwidth according to aspects of the present disclosure.

FIG. 6A illustrates a filter 600A that reduces loss (e.g., insertion loss) and achieves sharp filter roll off and increased bandwidth, according to aspects of the present disclosure. For illustrative purposes, some or all of the labelling and numbering of the components and features of FIG. 6A are similar to those of FIG. 4. FIG. 6A illustrates acoustic filter(s) only on one side of the semiconductor device 620. For example, the second acoustic filter 614 is coupled to the second surface 618 of the semiconductor device 620 and no acoustic filters are coupled to the first surface 616.

Figure 6B:
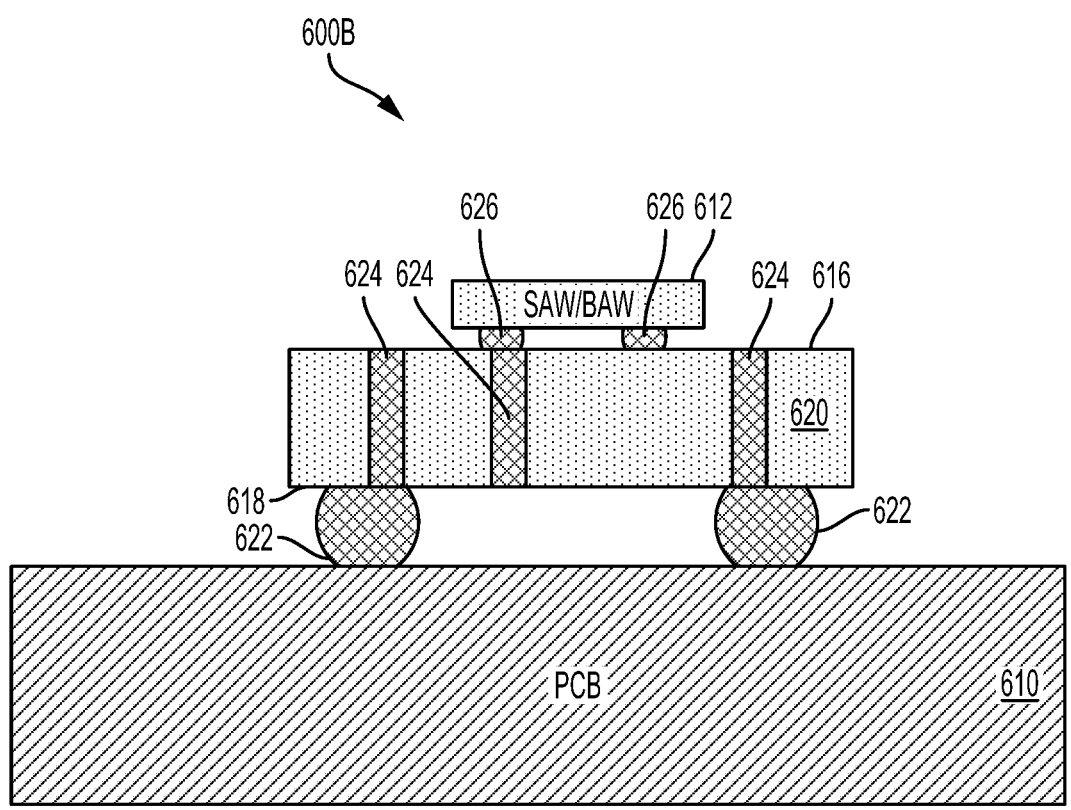

FIG. 6B illustrates a filter 600B that reduces loss (e.g., insertion loss) and achieves sharp filter roll off and increased bandwidth, according to aspects of the present disclosure. For illustrative purposes, some or all of the labelling and numbering of the components and features of FIG. 6B are similar to those of FIG. 4.

FIG. 6B illustrates acoustic filter(s) only on one side of the semiconductor device 620. For example, the first acoustic filter 612 is coupled to the first surface 616 of the semiconductor device 620 and no acoustic filters are coupled to the second surface 618.

Figure 7:
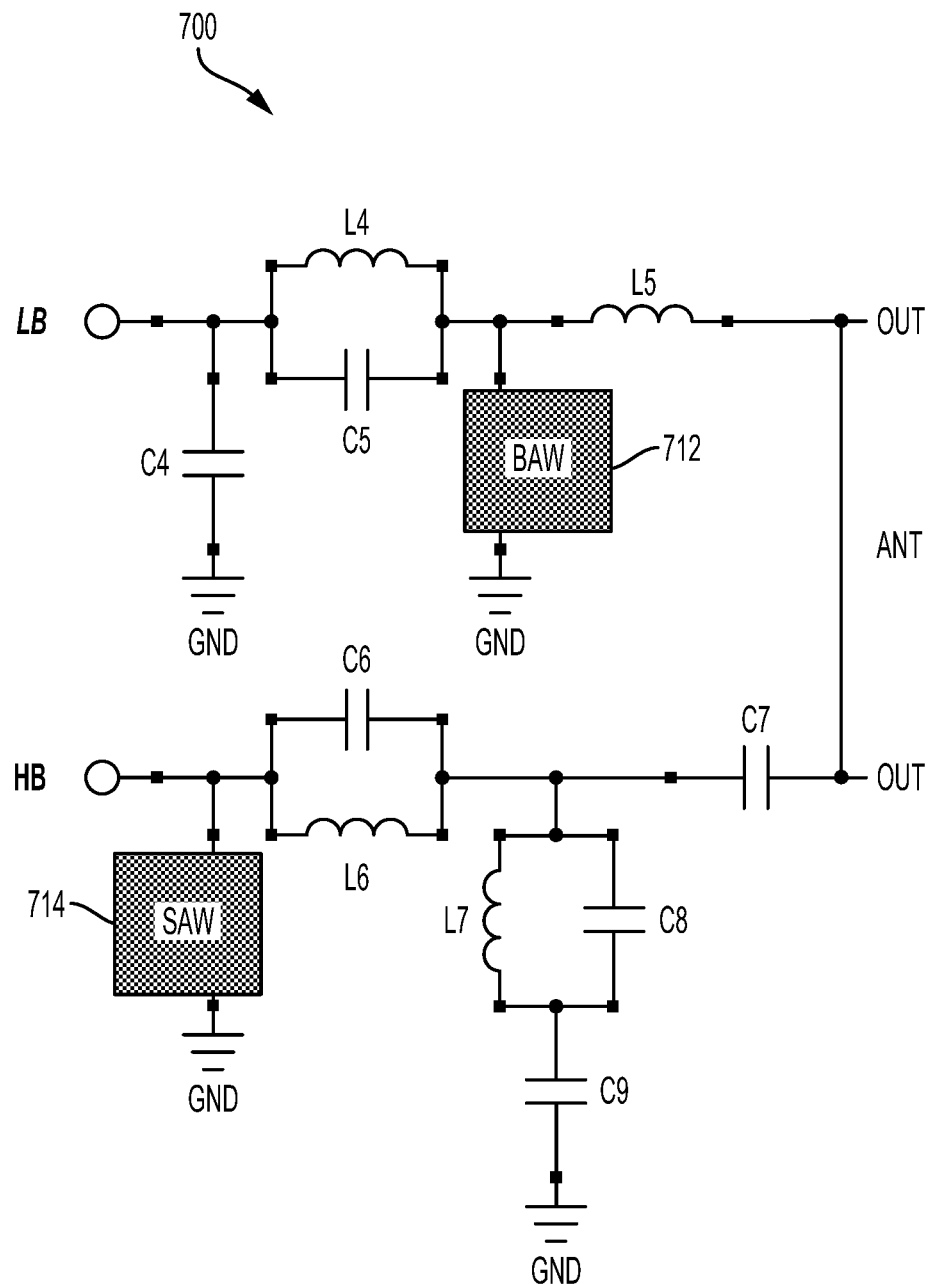
FIG. 7 is a schematic diagram of a filter that reduces loss (e.g., insertion loss) and achieves sharp filter roll off and increased bandwidth according to an aspect of the present disclosure.

FIG. 7 is a schematic diagram of a filter 700 that reduces loss (e.g., insertion loss) and achieves sharp filter roll off and increased bandwidth, according to an aspect of the present disclosure. In one aspect of the present disclosure, the filter may be a band pass filter including a low band portion (LB) and a high band portion (HB). The filter may be implemented in a diplexer with very close band spacing (e.g., 100 MHz). For example, the diplexer may include an LC resonator integrated with one or more acoustic filters. The LC resonator may include the inductors, L4, L5, L6, and L7 as well as capacitors C4, C5, C6, C7, C8, and C9. For example, a resonator, (e.g., made up of a parallel LC pair) of the LC resonator may be replaced with an acoustic filter (e.g., acoustic filter 712/714) to integrate or combine the acoustic filter with the LC resonator.

In one aspect, at least a portion of the LC components of the low band portion may be implemented within a semiconductor device (e.g., semiconductor device 620/630). A first acoustic filter 712 (e.g., first acoustic filter 612) may be stacked on the semiconductor device. For example, the first acoustic filter 712 may be a bulk acoustic wave (BAW) filter, which is better for higher frequency. The low band portion implemented within the semiconductor device may include inductors and capacitors such as passive-on-glass inductors and capacitors. For example, the inductors and capacitors of the low band portion may include capacitors C4 and C5, and inductors L4 and L5. The capacitors and inductors of the low band portion are coupled to the first acoustic filter 712 to achieve very high quality (Q)-factor and sharp roll off associated with acoustic filters and increased bandwidth associated with the low Q characteristics of the passive-on-glass inductors and capacitors.

In one aspect, at least a portion of the high band portion (e.g., the LC components) may be implemented within a semiconductor device (e.g., semiconductor device 620/630) and a second acoustic filter 714 (e.g., second acoustic filter 614) stacked on the semiconductor device. For example, the second acoustic filter 714 may be a surface acoustic wave (SAW) filter, which is better for lower frequency. The LC components of the high band portion implemented within the semiconductor device may include passive-on-glass inductors and capacitors. For example, the inductors and capacitors of the high band portion may include capacitors C6, C7, C8, and C9 and inductors L6 and L7. The capacitors and inductors of the high band portion are coupled with the second acoustic filter 714 to achieve very high Q-factor and sharp roll off associated with acoustic filters and increased bandwidth associated with the passive-on-glass inductors and capacitors.

The combination of the acoustic filters (e.g., 712 and 714) and the semiconductor device 620/630 (e.g., inductors and capacitors of the passive-on-glass devices) enables the resulting filter to achieve very high Q-factor and sharp roll off associated with acoustic filters and increased bandwidth associated with the low Q characteristics of the passive-on-glass devices. For example, the insertion loss of passive-on-glass filters may be greater than 3 dB while the insertion loss associated with the combination of the passive-on-glass devices and the acoustic filters may be as low as 1 dB. Moreover, the rejection (e.g., 20 dB) for the combination of the passive-on-glass devices and the acoustic filters is better than the rejection (e.g., 19 dB) of the passive-on-glass devices.

Aspects of the present disclosure achieve integration of narrowband and wideband filters using multiple technologies including configurations of passive-on-glass devices combined with acoustic filters. The design reduces parasitics (e.g., parasitic resistance, capacitance, or inductance) between the acoustic filter and the semiconductor device (or passive-on-glass device). The acoustic filters can be positioned very close (e.g., on top of each other and separated by less than a 100 microns) to the semiconductor devices 620/630 to reduce the parasitics.

Figure 8:
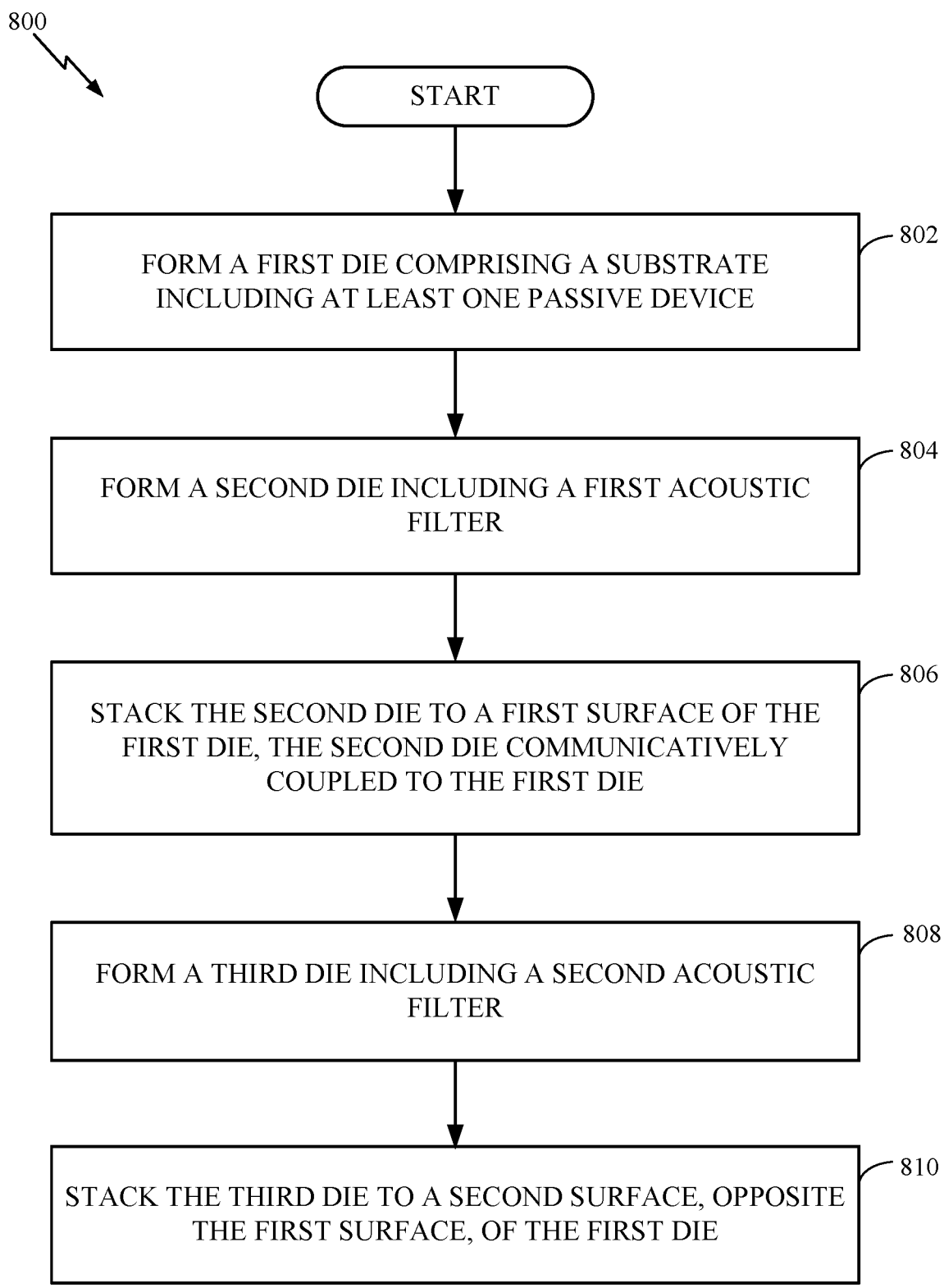
FIG. 8 is a process flow diagram illustrating a method of making an integrated radio frequency circuit or filter according to an aspect of the present disclosure.

FIG. 8 is a process flow diagram illustrating a method 800 of making an integrated radio frequency circuit or filter according to an aspect of the present disclosure. In block 802, a first die comprising a substrate including at least one passive device is formed. In block 804, a second die comprising a first acoustic filter is formed. In block 806, the second die is stacked on a first surface of the first die. The second die is communicatively coupled to the first die. In block 808, a third die including a second acoustic filter is formed. At block 810, the third die is stacked and coupled to a second surface, opposite the first surface, of the first die.

Figure 9:
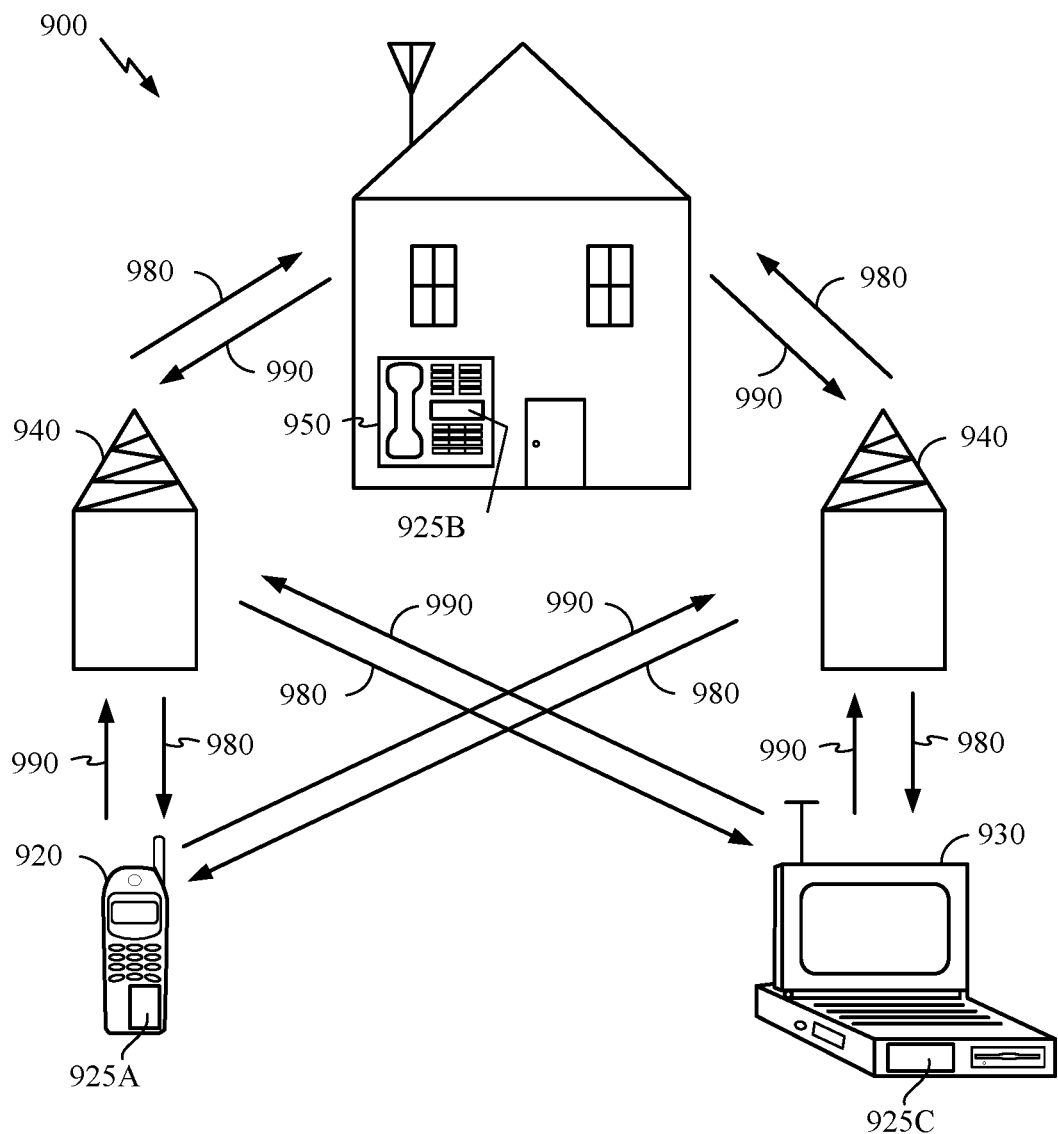
FIG. 9 is a block diagram showing an exemplary wireless communication system in which a configuration of the disclosure may be advantageously employed.

FIG. 9 is a block diagram showing an exemplary wireless communication system 900 in which an aspect of the disclosure may be advantageously employed. For purposes of illustration, FIG. 9 shows three remote units 920, 930, and 950 and two base stations 940. It will be recognized that wireless communication systems may have many more remote units and base stations. Remote units 920, 930, and 950 include IC devices 925A, 925C, and 925B that include the disclosed integrated radio frequency circuit. It will be recognized that other devices may also include the disclosed integrated radio frequency circuit, such as the base stations, switching devices, and network equipment. FIG. 9 shows forward link signals 980 from the base stations 940 to the remote units 920, 930, and 950 and reverse link signals 990 from the remote units 920, 930, and 950 to base stations 940.

In FIG. 9, remote unit 920 is shown as a mobile telephone, remote unit 930 is shown as a portable computer, and remote unit 950 is shown as a fixed location remote unit in a wireless local loop system. For example, the remote units may be a mobile phone, a hand-held personal communication systems (PCS) unit, a portable data unit such as a personal data assistant, a GPS enabled device, a navigation device, a set top box, a music player, a video player, an entertainment unit, a fixed location data unit, such as a meter reading equipment, or other devices that store or retrieve data or computer instructions, or combinations thereof. Although FIG. 9 illustrates remote units according to the aspects of the disclosure, the disclosure is not limited to these exemplary illustrated units. Aspects of the disclosure may be suitably employed in many devices, which include the integrated radio frequency circuit.

Figure 10:
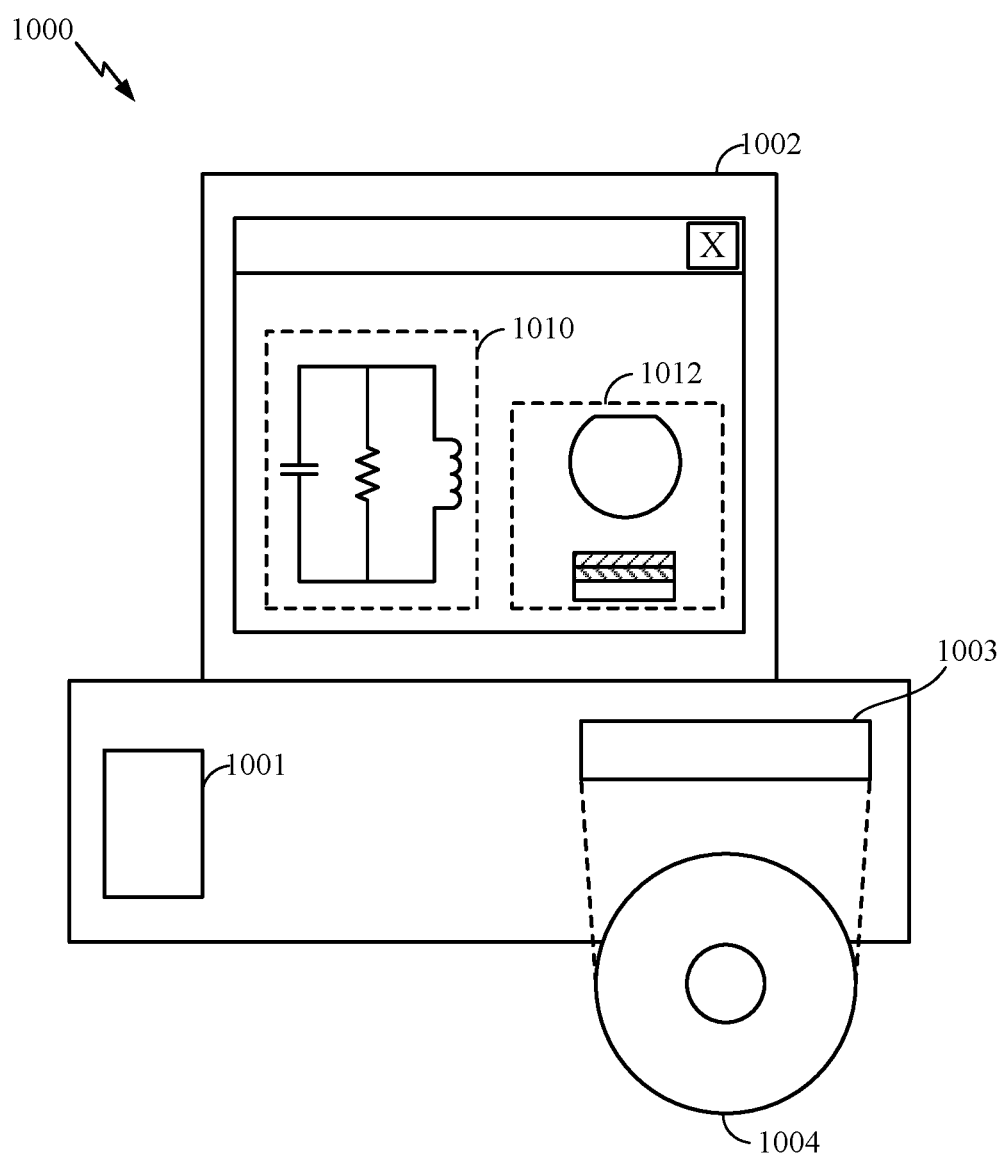
FIG. 10 is a block diagram illustrating a design workstation used for circuit, layout, and logic design of a semiconductor component.

FIG. 10 is a block diagram illustrating a design workstation used for circuit, layout, and logic design of a semiconductor component, such as the integrated radio frequency circuit disclosed above. A design workstation 1000 includes a hard disk 1001 containing operating system software, support files, and design software such as Cadence or OrCAD. The design workstation 1000 also includes a display 1002 to facilitate design of a circuit 1010 or a semiconductor component 1012 such as an integrated radio frequency circuit in accordance with an aspect of the present disclosure. A storage medium 1004 is provided for tangibly storing the design of the circuit 1010 or the semiconductor component 1012. The design of the circuit 1010 or the semiconductor component 1012 may be stored on the storage medium 1004 in a file format such as GDSII or GERBER. The storage medium 1004 may be a CD-ROM, DVD, hard disk, flash memory, or other appropriate device. Furthermore, the design workstation 1000 includes a drive apparatus 1003 for accepting input from or writing output to the storage medium 1004.

Data recorded on the storage medium 1004 may specify logic circuit configurations, pattern data for photolithography masks, or mask pattern data for serial write tools such as electron beam lithography. The data may further include logic verification data such as timing diagrams or net circuits associated with logic simulations. Providing data on the storage medium 1004 facilitates the design of the circuit 1010 or the semiconductor component 1012 by decreasing the number of processes for designing semiconductor wafers.

Although the present disclosure and its advantages have been described in detail, it should be understood that various changes, substitutions, and alterations can be made herein without departing from the technology of the disclosure as defined by the appended claims. For example, relational terms, such as "above" and "below" are used with respect to a substrate or electronic device. Of course, if the substrate or electronic device is inverted, above becomes below, and vice versa. Additionally, if oriented sideways, above and below may refer to sides of a substrate or electronic device. Moreover, the scope of the present application is not intended to be limited to the particular configurations of the process, machine, manufacture, composition of matter, means, methods, and steps described in the specification. As one of ordinary skill in the art will readily appreciate from the disclosure, processes, machines, manufacture, compositions of matter, means, methods, or steps, presently existing or later to be developed that perform substantially the same function or achieve substantially the same result as the corresponding configurations described herein may be utilized according to the present disclosure. Accordingly, the appended claims are intended to include within their scope such processes, machines, manufacture, compositions of matter, means, methods, or steps.

Those of skill would further appreciate that the various illustrative logical blocks, modules, circuits, and algorithm steps described in connection with the disclosure herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the disclosure herein may be implemented or performed with a general-purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, multiple microprocessors, one or more microprocessors in conjunction with a DSP core, or any other such configuration.

The steps of a method or algorithm described in connection with the disclosure may be embodied directly in hardware, in a software module executed by a processor, or in a combination of the two. A software module may reside in RAM, flash memory, ROM, EPROM, EEPROM, registers, hard disk, a removable disk, a CD-ROM, or any other form of storage medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

In one or more exemplary designs, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can include RAM, ROM, EEPROM, CD-ROM or other optical disk storage, magnetic disk storage or other magnetic storage devices, or any other medium that can be used to carry or store specified program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk, and Blu-ray disc where disks usually reproduce data magnetically, while discs reproduce data optically with lasers. Combinations of the above should also be included within the scope of computer-readable media.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein but is to be accorded the widest scope consistent with the principles and novel features disclosed herein.

What is claimed is:

1. An integrated radio frequency circuit, comprising:
   a passive-on-glass filter including a first die comprising a glass substrate including at least one passive device, the at least one passive device comprising at least one of an inductor and a capacitor;
   a second die comprising a surface acoustic wave (SAW) filter, the second die coupled to a first surface of the first die; and
   a third die comprising a bulk acoustic wave (BAW) filter, the third die coupled to a second surface opposite the first surface of the first die, the first surface and the second surface being planar surfaces.

2. The integrated radio frequency circuit of claim 1, in which the first die comprises integrated passive devices (IPDs), and the second die is directly coupled to a passive device layer of the first die.

3. The integrated radio frequency circuit of claim 2, in which the IPDs comprise two-dimensional (2D) passive devices or three-dimensional (3D) passive devices.

4. The integrated radio frequency circuit of claim 1, in which the first die comprises passive-on-glass (POG) devices, and the second die is directly coupled to the POG devices of the first die.

5. The integrated radio frequency circuit of claim 4, in which the POG devices comprise two-dimensional (2D) passive devices or three-dimensional (3D) passive devices.

6. The integrated radio frequency circuit of claim 1, in which the third die is coupled to the second die by a via through the first die.

7. The integrated radio frequency circuit of claim 6, in which the first die comprises glass and the via comprises a through glass via.

8. The integrated radio frequency circuit of claim 1, further comprising a fourth die comprising a third acoustic filter coupled to the first surface of the first die.

9. The integrated radio frequency circuit of claim 1, further comprising a fifth die comprising a fourth acoustic filter coupled to the second surface of the first die.

10. The integrated radio frequency circuit of claim 1, incorporated into a multiplexer.

11. A method of fabricating an integrated radio frequency circuit, comprising:
    fabricating a passive-on-glass filter including a first die comprising a glass substrate including at least one passive device, the at least one passive device comprising at least one of an inductor and a capacitor;
    fabricating a second die comprising a surface acoustic wave (SAW) filter;
    stacking the second die on a first surface of the first die, the second die communicatively coupled to the first die;
    fabricating a third die comprising a bulk acoustic wave (BAW) filter; and
    stacking the third die to a second surface opposite the first surface of the first die, the third die communicatively coupled to the first die, the first surface and the second surface being planar surfaces.

12. The method of fabricating the integrated radio frequency circuit of claim 11, further comprising directly coupling the second die to a passive device layer of the first die.

13. The method of fabricating the integrated radio frequency circuit of claim 11, further comprising directly coupling the second die to passive-on-glass (POG) devices of the first die.

14. The method of fabricating the integrated radio frequency circuit of claim 11, further comprising coupling the third die to the second die by a via through the first die.

15. The method of fabricating the integrated radio frequency circuit of claim 11, further comprising stacking and coupling a third acoustic filter of a fourth die to the first surface of the first die.

16. The method of fabricating the integrated radio frequency circuit of claim 11, further comprising stacking and coupling a fourth acoustic filter of a fifth die to the second surface of the first die.

17. The method of fabricating the integrated radio frequency circuit of claim 11, in which the first die comprises integrated passive devices (IPDs).

18. The method of fabricating the integrated radio frequency circuit of claim 17, in which the IPDs comprise two-dimensional (2D) passive devices and/or three-dimensional (3D) passive devices.

19. The method of fabricating the integrated radio frequency circuit of claim 11, further comprising integrating the integrated radio frequency circuit into a multiplexer.

* * * * *